United States Patent
Peters et al.

[11] Patent Number: 6,097,039
[45] Date of Patent: Aug. 1, 2000

[54] SILICON CARBIDE SEMICONDUCTOR CONFIGURATION WITH A HIGH DEGREE OF CHANNEL MOBILITY

[75] Inventors: Dethard Peters, Höchstadt; Reinhold Schörner, Grossenseebach; Dietrich Stephani, Bubenreuth, all of Germany

[73] Assignee: Siemens Aktiengesellschaft, Munich, Germany

[21] Appl. No.: 09/407,260

[22] Filed: Sep. 28, 1999

Related U.S. Application Data

[63] Continuation of application No. PCT/DE98/00738, Mar. 12, 1998.

[30] Foreign Application Priority Data

Mar. 25, 1997 [DE] Germany ............... 197 12 561

[51] Int. Cl.⁷ .................................................. H01L 31/0312
[52] U.S. Cl. ........................................... 257/77; 257/628
[58] Field of Search ........................... 257/77, 328, 628; 438/105, 931

[56] References Cited

U.S. PATENT DOCUMENTS

| | | | |
|---|---|---|---|
| 5,011,549 | 4/1991 | Kong et al. | 148/33.1 |
| 5,363,800 | 11/1994 | Larkin et al. | 438/507 |
| 5,736,753 | 4/1998 | Ohno et al. | 257/77 |
| 5,958,132 | 9/1999 | Takahashi et al. | 117/84 |
| 5,977,564 | 11/1999 | Kobayashi et al. | 257/77 |

FOREIGN PATENT DOCUMENTS

| | | |
|---|---|---|
| 0 518 683 A1 | 12/1992 | European Pat. Off. . |
| 1 807 857 | 7/1969 | Germany . |
| 196 11 043 A1 | 10/1996 | Germany . |
| WO 89/04056 | 5/1989 | WIPO .................. H01L 21/265 |

OTHER PUBLICATIONS

International Patent Application WO 95/34915 (Tornblad), dated Dec. 21, 1995.

Hiroyuki Matsunami et al.: "Step–Controlled Epitaxial Growth of SIC", Mat. Res. Symp. Proc., vol. 162, 1990, pp. 397–407.

Philip G. Neudeck et al.: "Four–Fold Improvement of 3C–SiC PN Junction Diode Blocking Voltage Obtained Through Improved CVD Epitaxy on Low–Tilt–Angle 6H–DiC Wafers", International Electron Devices Meeting 1992, IEEE, San Francisco, Dec. 13–16, 1992, pp. 1003–1005, XP 000687597.

Tsunenobu Kimoto et al.: "Step bunching in chemical vapor deposition of 6H– and 4H–SiC on vicinal SiC(0001) faces", Appl. PHys. Lett., vol. 66, No. 26, Jun. 26, 1995, pp. 3645–3647.

*Primary Examiner*—Steven H. Loke
*Assistant Examiner*—Shouxiang Hu
*Attorney, Agent, or Firm*—Herbert L. Lerner; Laurence A. Greenberg; Werner H. Stemer

[57] ABSTRACT

An SiC channel region of a semiconductor configuration, as a result of misoriented epitaxial growth on its surface, is formed with mutually parallel elevations. The flow of electric current in the channel region is set parallel with the elevations. As a result, a high degree of charge-carrier mobility in the channel region is obtained.

21 Claims, 4 Drawing Sheets

6,097,039

SILICON CARBIDE SEMICONDUCTOR CONFIGURATION WITH A HIGH DEGREE OF CHANNEL MOBILITY

CROSS-REFERENCE TO RELATED APPLICATION

This is a continuation of copending International Application PCT/DE98/00738, filed Mar. 12, 1998, which designated the United States.

BACKGROUND OF THE INVENTION

Field of the Invention

The invention lies in the field of semiconductor technology and relates, more specifically, to a semiconductor configuration.

Silicon carbide (SiC) in monocrystalline form is a semiconductor material with outstanding physical properties which make this semiconductor material particularly useful in high temperature electronics and power electronics.

A power MISFET (Metal Insulator Semiconductor Field Effect Transistor) on SiC basis is known in the art. That transistor has a substrate made of monocrystalline SiC of the 4H or 6H polytype and an epitaxial layer made of SiC which is arranged on a substrate surface of the substrate and is of a predefined conductivity type (n-type or p-type conductivity) and is of the same polytype as the SiC substrate. In the SiC epitaxial layer, a base region of the opposite conductivity type to the SiC epitaxial layer is produced by ion implantation, and a source region of the same conductivity type as the SiC epitaxial layer is produced in the base region by ion implantation. The base region and source region are brought into contact by a source electrode and short-circuited to one another. A silicon dioxide layer (oxide layer) as insulator layer of the MIS structure is arranged on a surface of the base region, and a gate electrode is arranged, as metal layer of the MIS structure, on the oxide layer. By applying an electrical field to the gate electrode, a channel region which is near to the surface in the base region underneath the oxide layer can be controlled in terms of its electrical resistance. To be precise, when there is a specific control field, the conductivity type of the channel region changes as a result of charge-carrier inversion and a conductive channel of the same conductivity type as the source region and SiC epitaxial layer (drift region) is produced on the surface of the base region. The MISFET is then in its on state in which an electric current flows through the channel region to the drain electrode when an operating voltage is applied between the source electrode and a drain electrode. The drain electrode can be arranged on the rear of the substrate (vertical MISFET) or on the same surface as the source electrode (lateral MISFET).

U.S. Pat. No. 5,011,549 to Kong et al. discloses a method for the homoepitaxial deposition growth of an SiC epitaxial layer on an Alpha-SiC (α-SiC) substrate by means of chemical gas phase deposition (CVD=Chemical Vapor Deposition). The term Alpha-SiC or α-SiC covers all the polytypes with a monocrystalline SiC with a hexagonal or rhombohedral crystalline structure, which are usually used in this context. In that prior art epitaxial method, the substrate surface of the SiC substrate is prepared before the deposition of the SiC epitaxial layer by mechanical processing, for example sawing, in such a way that the surface is tilted at a predefined angle between 3° and 6° toward one of the two {0001} crystal faces (or one of the associated <0001> crystal directions), that is to say toward the (0001) crystal face (Si side) or toward the (0001) crystal face (C side) in the direction of one of the <1120> crystal directions (misorientation, "off-axis orientation"). On the substrate surface which is prepared in this way, the SiC epitaxial layer is deposited from a process gas mixture containing silicon and carbon by means of a CVD process at temperatures between 1400° C. and 1700° C. The SiC epitaxial layers which are manufactured with this misoriented epitaxial method have, given suitable process control, a polytype which is indeed the same as the SiC substrate, and are of better crystallographic quality, and their conductivity can be set more precisely, than comparable layers which are grown directly on one of the {0001} crystal faces themselves. However, owing to the growth mechanism which is controlled in steps, the SiC epitaxial layers which are grown with misorientation have on their surfaces microscopic steps and edges whose width and height depend on the tilt angle of the substrate surface.

In Materials Research Society Symposium Proceedings, Vol. 162, 1990, pages 397–407, an epitaxial growth of 6H-SiC layers on 6H-SiC substrates which are misoriented toward the (0001) crystal faces by an angle between 3° and 6°, by means of CVD at a temperature of 1500° C., is described. When the substrate surface is tilted in the direction of the [1120] crystal direction of the 6H-SiC substrate, microsteps with a zigzag-line shape are produced on the surface of the grown 6H-SiC epitaxial layer, the main direction of extent of the microsteps being directed in each case parallel with the [1110] crystal direction of the 6H-SiC epitaxial layer and their individual zigzag sections running parallel with the hexagonal crystal edges. In contrast, when the substrate surface is tilted in a direction of rotation with respect to the [1110] crystal direction of the 6H-SiC substrate, linear microsteps, which are each directed parallel with the [1120] crystal direction of the 6H-SiC epitaxial layer are found on the surface of the 6H-SiC epitaxial layer.

Applied Physics Letters, Vol. 66, No. 26, Jun. 26, 1995, pages 3645–47 describes, in the context of a misoriented epitaxial method, not only the production of microsteps but also the accumulation of microsteps ("step bunching") to form relatively large hill-and-valley macrostep structures on the surface of 4H-SiC and 6H-SiC epitaxial layers. The 4H-SiC and 6H-SiC epitaxial layers are deposited on 4H and/or 6H-SiC substrates, which are misoriented by 3° to 10° with respect to the [1120] crystal direction, by means of CVD at a temperature of 1500° C. The height of the microsteps which are produced during the growth is always an integral multiple of an Si—C double atom layer (approximately 0.25 nm) owing to the growth mechanism, and it is on average three double layers in the case of 6H-SiC and on average four double layers in the case of 4H-SiC. The width of the microsteps is on average 12 nm in the case of 6H-SiC and 17 nm in the case of 4H-SiC. Corrugated or hill-and-valley macrostep structures have been observed in the case of epitaxial growth on a substrate surface which is tilted toward the (0001) Si face, but not in the case of growth on a substrate surface which is tilted toward the [0001] C face. The probability of the macrosteps being formed decreases the greater the tilt angle of the misorientation of the substrate surface. The measured height of the macrostep is 3 nm in the case of 6H-SiC epitaxial layers, and 10 nm to 15 nm in the case of 4H-SiC epitaxial layers. The width of the terraces between the steps was found to be 280 nm in the case of 6H-SiC and between 110 nm and 160 nm in the case of 4H-SiC.

SUMMARY OF THE INVENTION

It is accordingly an object of the invention to provide a semiconductor configuration having at least one channel region made of SiC, which overcomes the above-mentioned disadvantages of the heretofore-known devices and methods of this general type and which exhibits high charge-carrier mobility in the channel region.

With the foregoing and other objects in view there is provided, in accordance with the invention, a semiconductor configuration, comprising:

a semiconductor body formed with at least one channel region (current-conducting or current-carrying region) made of monocrystalline α-SiC defining <1$\bar{1}$00> and <11$\bar{2}$0> crystal directions and having a surface formed with elevations extending substantially parallel to one another and substantially parallel with one of the <1$\bar{1}$00> or one of the <11$\bar{2}$0> crystal directions of the α-SiC; and an electronically active structure having at least two electrodes causing an electric current to flow through the channel region when an electric operating voltage is applied in an on state of the electronically active structure, the current flowing at least largely parallel with the elevations on the surface of the channel region.

With the above and other objects in view there is also provided, in accordance with the invention, a semiconductor configuration which comprises:

a substrate made of α-SiC defining {0001} crystal faces, and <0001>, <1$\bar{1}$00>, and <11$\bar{2}$0> crystal directions, the substrate having a substrate surface inclined against one of the {0001} crystal faces by a predefined angle between substantially 1° and substantially 20° with respect to a reference direction perpendicular to one of the <0001> crystal directions of the α-SiC, the reference direction being the <1$\bar{1}$00> or the <11$\bar{2}$0> crystal direction;

an α-SiC layer homoepitaxially grown on the substrate surface of the substrate, the α-SiC layer having a remote surface facing away from the substrate surface;

a channel region formed in the remote surface of the α-SiC layer; and an electronically active structure having at least two electrodes causing an electric current to flow through the at least one channel region when an electric operating voltage is applied in an on state thereof, whereby the electric current flows at least predominantly perpendicular with respect to the reference direction and perpendicular with respect to a direction selected from the group consisting of the <0001> crystal directions of the α-SiC of the substrate and the <0001> crystal directions of the α-SiC layer.

Both solutions according to the invention are based on the fact that the mobility of the charge carriers (electrons or holes) which carry the electric current in the SiC channel region depends heavily on the surface structure of the SiC channel region and is anisotropic, i.e. different for different directions of current in the SiC crystal of the channel region.

In the first of the above semiconductor configurations, the surface of the SiC channel region has elevations, in particular in the form of steps or corrugations, which are already directed parallel with one another and which to a large degree prevent a flow of electric current in the SiC channel region if the electric current has to intersect one or more of these elevations. The charge-carrier mobility is at its maximum parallel with the elevations, and the electrical resistance which is offered to the electric current in the SiC channel region is therefore at a minimum. In contrast, in the perpendicular (orthogonal) direction with respect to the elevations the charge-carrier mobility is at a minimum and the electric resistance is correspondingly at a maximum.

This anisotropy of the charge-carrier mobility on the structured SiC surface is taken into account in the first embodiment in the layout of a semiconductor configuration having a channel region arranged on the surface, in that the electric current, at least insofar as it is conducted on the SiC surface with the elevations, is set at least largely parallel with the elevations. With this measure, it is possible to compensate in practice the disruptive influences of any surface unevennesses which, at least in certain areas, run parallel with one another.

Parallel surface elevations occur, in particular, on the surface of SiC semiconductor regions which have been grown homoepitaxially on misoriented SiC substrate surfaces in accordance with an epitaxial CVD growth process. It has become apparent that such elevations on the surface occurred again even after possibly being removed by grinding or similar methods. In experimental investigations, macrosteps with a height between approximately 20 nm and approximately 80 nm, and terraces between them with a width between 500 nm and 2000 nm have, to be precise, also been observed, in particular with high implantation rates, on originally smooth surfaces of SiC semiconductor regions which have been grown with misorientation, after the thermal annealing of semiconductor regions implanted in these SiC semiconductor regions, at annealing temperatures typically above 1000° C. Furthermore, microsteps, which are formed owing to the different oxidation rates for different crystallographic planes, have also been observed under the gate oxide on the surface of the channel region when there is thermal oxidation of the surface of the SiC semiconductor region which is grown with misorientation, at oxidation temperatures of typically 1100° C. in order to produce a gate oxide of a MOS (Metal Oxide Semiconductor) structure. Both in the case of thermal annealing and also in the case of thermal oxidation, the steps were in the same direction as the steps which were produced directly after the epitaxy on misoriented substrates. Both processes, therefore, promote the formation of steps to the same degree. Now since generally at least one of the processes of iron implantation or oxidation is used to fabricate SiC semiconductor configurations, the tilting of the substrate surface in the case of the epitaxial process thus always give rise to elevations (microsteps and macrosteps) which are parallel with one another on the surface of the grown SiC epitaxial layer.

In the second above-outlined embodiment (claim 14 et seq.), the electronically active structure is therefore formed in the layout of the semiconductor configuration with the alpha-silicon carbide (α-SiC) layer which is grown homoepitaxially on a misoriented substrate surface, in such a way that the electric current flows through the at least one channel region, at least largely parallel with a direction which is crystallographically predefined. The particular direction of current is set to be perpendicular with respect to the reference direction and perpendicular with respect to one of the <0001> crystal directions of the α-SiC. As a result of these measures, the charge-carrier mobility in the channel region becomes, from the outset, independent to an optimized degree of further technology steps such as, for example, a subsequent oxidation on the surface of the channel region.

The term α-SiC, also alpha-silicon carbide, covers all polytypes of monocrystalline SiC with a hexagonal or rhombohedral crystal structure, in particular the 4H or 6H polytype.

In accordance with an additional feature of the invention, the elevations on the surface of the channel region run substantially parallel with a [1$\bar{1}$00] crystal direction of the α-SiC.

In accordance with another feature of the invention, the elevations on the surface of the channel region are each formed with edges and/or steps.

In accordance with a preferred variations of the invention, these elevations are substantially rectilinear or they run in a zigzag shape.

In accordance with a further feature of the invention, the elevations have a height between substantially 0.25 nm and substantially 80 nm, and a width of between 10 nm and 2000 nm.

In accordance with again an added feature of the invention, the surface of the channel region is substantially rectangular, with first and second sides extending parallel to the elevations and third and fourth sides extending perpendicular to the elevations.

In another embodiment, the elevations on the surface of the SiC channel region can run essentially parallel with one of the crystal directions of the α-SiC, of which there are in turn six in the hexagonal system.

In accordance with again an additional feature of the invention, specifically provided in the context of the second above-outlined embodiment, the reference direction is the [11$\bar{2}$0] crystal direction of the α-SiC of the substrate.

In accordance with again another feature of the invention, the channel region has a surface coinciding with the remote surface of the layer, the coinciding surface being shaped substantially as a rectangle with a first side and a second side extending substantially perpendicular to the reference direction, and a third side and a fourth side extending substantially perpendicular to the first side and the second side. The sides of the rectangle which are directed parallel with the flow of current are selected to be as short as possible and the sides which are directed perpendicularly with respect to the current are selected to be as long as possible. The ratio of the length of the sides of the rectangle which are directed parallel with the flow of current to the length of the sides of the rectangle which are directed perpendicularly with respect to the flow of current is selected in particular to be 0.3 at maximum, and preferably 0.01 at maximum.

In accordance with a concomitant feature of the invention, the at least one channel region is implemented in a meandering shape.

The advantages of the measures according to the invention are particularly beneficial in field-controlled SiC semiconductor configurations in which the electrical resistance of SiC semiconductor regions (channel regions) which are near to the surface is controlled by changing the charge-carrier concentrations through the application of electrical fields to control electrodes. The higher degree of channel mobility of the charge carriers in the channel regions which is achieved with the measures according to the invention improves the switching behavior of these SiC semiconductor configurations and reduces the losses. Preferred, field-controlled semiconductor configurations are semiconductor configurations with MIS (Metal Insulator Semiconductor) structures, preferably with MOS (Metal Oxide Semiconductor) structures, in particular MISFETs (Metal Insulator Semiconductor Field Effect Transistor), IGBTs (Insulated Gate Bipolar Transistor) and MCTs (Mis or MOS controlled Thyristor). The invention can, however, also be applied in JFETs or GTOs.

Other features which are considered as characteristic for the invention are set forth in the appended claims.

Although the invention is illustrated and described herein as embodied in a SiC semiconductor configuration having a high degree of channel mobility, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Identical or functionally identical components are identified with the same designations throughout the figures.

DESCRIPTION OF THE PREFERRED EMBODIMENTS

Figure 1:
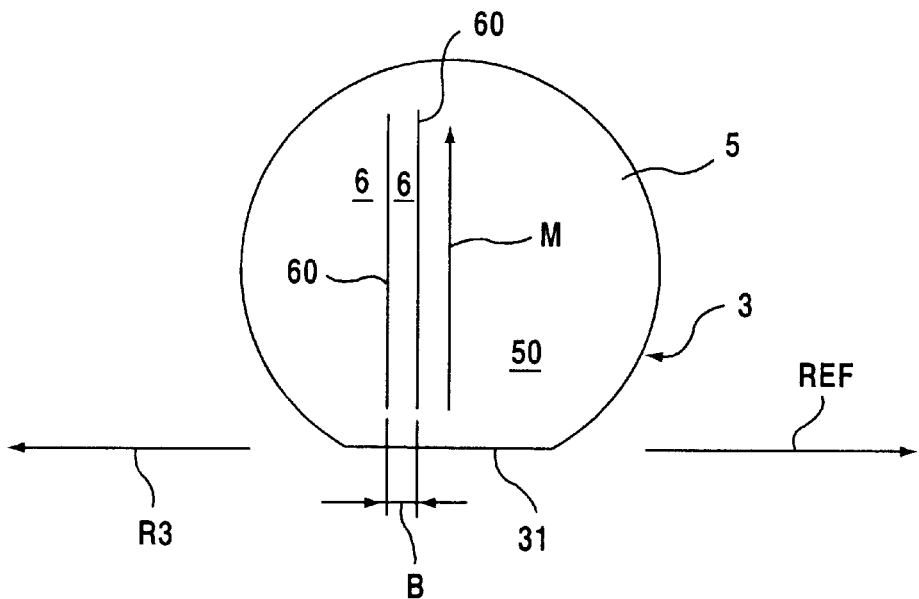
FIG. 1 is a diagrammatic plan view of a SiC surface with mutually parallel linear elevations.
Figure 2:
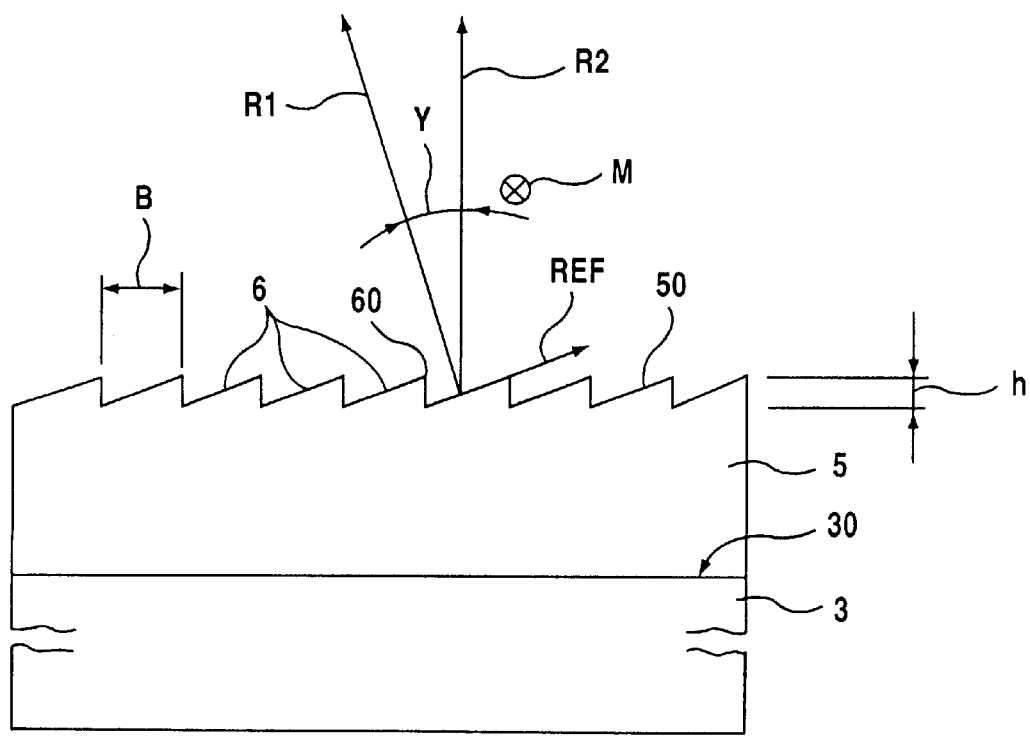
FIG. 2 is a sectional view of the SiC surface according to FIG. 1.

Referring now to the figures of the drawing in detail and first, particularly, to FIGS. 1 and 2 thereof, there is seen a semiconductor configuration with a substrate 3 made of monocrystalline, and thus semiconductive SiC, and a layer 5 arranged on a substrate surface 30 of the SiC substrate 3 and formed of monocrystalline SiC. The SiC substrate 3 is preferably fabricated by means of a sublimation growth process using a seed crystal. The substrate 3 is essentially composed of a single SiC polytype, for example of β-SiC (3C-SiC, cubic SiC) and preferably of one of the polytypes of α-SiC (hexagonal or rhombohedral SiC). Preferred polytypes for the SiC substrate 3 are the α-SiC polytypes 4H and 6H.

The layer 5 is grown homoepitaxially on the substrate 3 and, for this reason, has the same SiC crystal structure, and is therefore also of the same polytype, as the substrate 3. For the homoepitaxial deposition of the layer 5 on the SiC substrate 3, a suitable epitaxial method, for example epitaxy by means of physical deposition from sublimated SiC in the gas phase (Physical Vapor Deposition=PVD) and preferably epitaxy by means of chemical gas phase deposition (Chemical Vapor Deposition=CVD) is used. In a CVD epitaxial method, the SiC is deposited out of a gas mixture of one or more silicon-containing and carbon-containing process gases, for example silane and a hydrocarbon such as propane, and a carrier gas, for example hydrogen and/or inert gases, by means of chemical reaction. The deposition temperatures on the substrate 3 are usually between 1400° C. and 1800° C. The preferred temperature is about 1500° C. The static pressure in the gas atmosphere is preferably set between approximately 10,000 Pa and approximately 100,000 Pa.

If the substrate 3 is composed of α-SiC, the substrate surface 30 which is provided as growth face is prepared before the deposition of the SiC layer 5, for example by cutting, sawing or grinding, in such a way that its surface normal, which is designated by R2, is inclined in the direction of inclination (direction of rotation) with respect to a reference direction designated by REF by a predefined angle γ between approximately 1° and approximately 20°, in particular between approximately 2° and approximately 10° and preferably between approximately 3° and approximately 8° (3.5° for 6H-SiC and 8° for 4H-SiC) toward a direction which is designated by R1. The direction R1 is parallel with the [0001] crystal direction (polar c axis of the SiC crystal). Such a "misorientation" ("off-axis orientation") of the substrate surface 30 with respect to one of the {0001} crystal faces which are parallel with one another, specifically the (0001) crystal face which is designated as the silicon side or the crystal face (000$\bar{1}$) which is designated as the carbon side, of the SiC crystal of the substrate 3 produces a layer 5 of particularly good quality, and in particular ensures that the SiC layer 5 is of the same polytype as the SiC substrate 3, and does not exhibit any polytypism. In the SiC crystal system, the <0001> crystal directions are the outwardly directed normals of the corresponding {0001} crystal faces. The reference direction REF selected is generally a SiC crystal direction which is parallel with one of the {0001} crystal faces, in particular one of the six equivalent <11$\bar{2}$0> crystal directions in the hexagonal crystal lattice of 4H-SiC or 6H-SiC, or of the six equivalent <1100> crystal directions which are also found in the hexagonal crystal lattice of 4H-SiC or 6H-SiC. The best results are achieved with a tilting in the direction of the [11$\bar{2}$0] crystal direction of the α-SiC of the substrate 3. The SiC layer 3 is doped according to a desired conductivity type by adding appropriate dopant compounds during the CVD process, for example with boron (B) or aluminum (Al) for p-type doping or with nitrogen (N) for n-type doping.

Such epitaxial processes are known per se, for example from the three above-mentioned publications U.S. Pat. No. 5,011,549 (Kong et al.); Materials Research Society Symposium Proceedings, Vol. 162, 1990, pages 397–407; and Applied Physics Letters, Vol. 66, No. 26, Jun. 26, 1995, pages 3645–47. The disclosures of these publications are herewith incorporated by reference. From these publications it is also known, as was likewise mentioned at the beginning, that elevations in the form of steps or corrugations, which are designated by 6 in FIGS. 1 and 2, are formed on the layer surface 50 of the grown SiC layer 5 owing to the misoriented growth. The elevations 6 in FIGS. 1 and 2 each have a linear edge (step, cutting edge) 60 which runs parallel with a main direction designated by M (parallel to the drawing page in FIG. 1 and into the drawing page in FIG. 2). The main direction M is directed perpendicularly with respect to the tilting plane (plane of rotation), which is generated from two of the three directions R1 and R2 as well as REF. The tilting plane is determined by crystallographic means and is then marked by a reference section ("flat") 31. Each elevation 6 also has a terrace which rises gently up to the edge 60 with the angle of inclination γ, and a face which drops away steeply. The width of the elevations 6, which is determined by the distances between the edges 60, is designated by B and the height of the elevations 6 which is defined as the distance between the highest point and the lowest point is designated by h. The width B and the height h of the elevations 6 depend on the angle of inclination γ.

The illustrations in FIGS. 1 and 2 are idealized since the elevations 6 in reality often have different widths and heights and do not always have linear edges 60 either. Elevations 6 with linear edges 60 are produced especially if the reference direction REF is one of the <1$\bar{1}$00> crystal directions, in particular the [1$\bar{1}$00] crystal direction.

Figure 3:
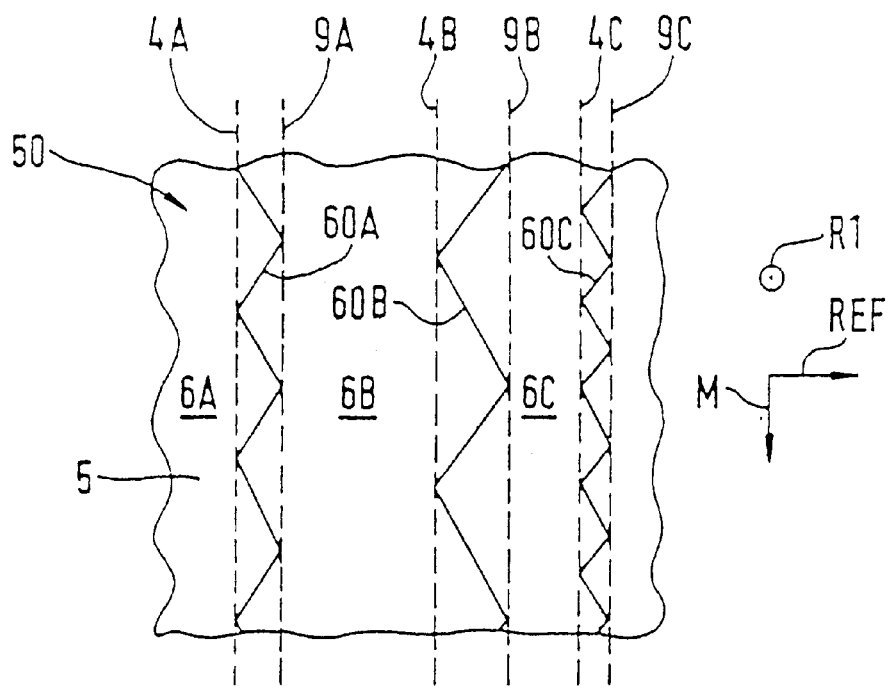
FIG. 3 is a plan view of a SiC surface with elevations running parallel with one another and each in a zigzag shape.
Figure 4:
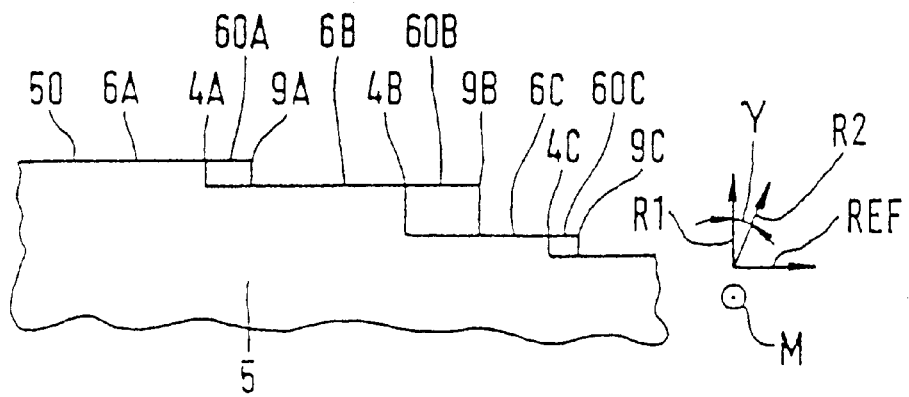
FIG. 4 is a sectional view of the SiC surface according to FIG. 3.

Referring now to FIGS. 3 and 4, there is shown a layer surface 50 of an α-SiC layer 5 which is grown homoepitaxially by means of a CVD process on a substrate surface 30 which is inclined with respect to one of the <11$\bar{2}$0> crystal directions, preferably the [11$\bar{2}$0] crystal direction of the α-SiC of the substrate 3 as a reference direction REF. The layer surface 50 has elevations, only three elevations 6A to 6C of which are shown by way of example. Each elevation 6A to 6C ends in a zigzag-shaped edge 60A to 60C, each of which runs between two main lines 4A and 9A or 4B and 9B or 4C and 9C. All the main lines 4A to 4C and 9A to 9C are directed parallel with the main direction M. The individual edge parts run between the main lines along the crystal edges of the hexagonal SiC crystal lattice. The widths, determined by the distances between two corresponding main lines of different elevations, for example 4A and 4B, and the heights of the elevations 6A to 6C may vary and are in all cases dependent again on the tilting angle γ between the directions R1 and R2.

Figure 5:
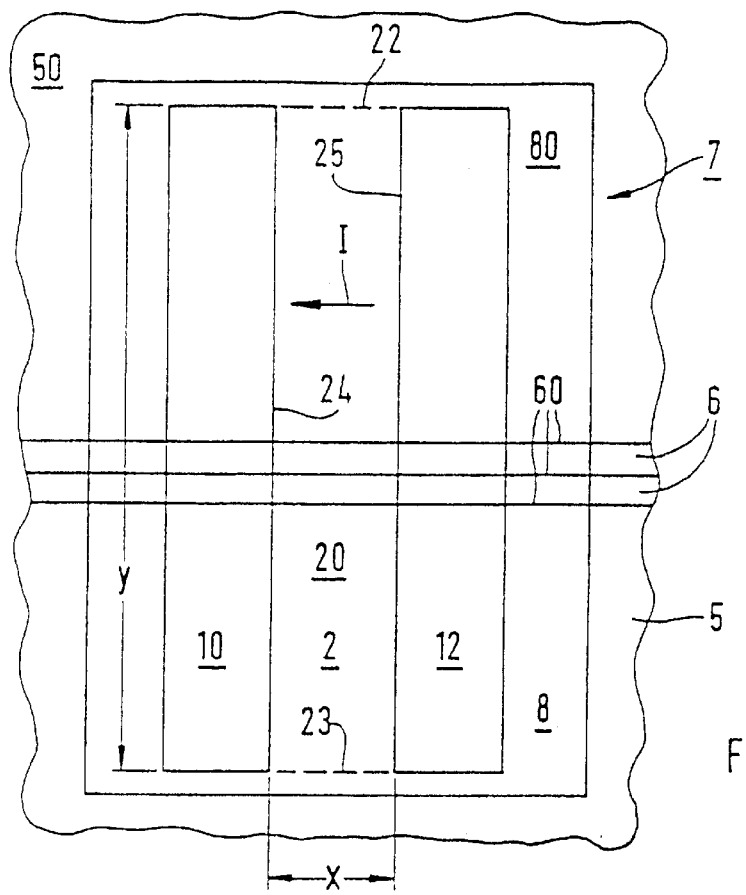
FIG. 5 is a plan view of a semiconductor configuration provided for a lateral SiC MOSFET with rectangular layout.
Figure 6:
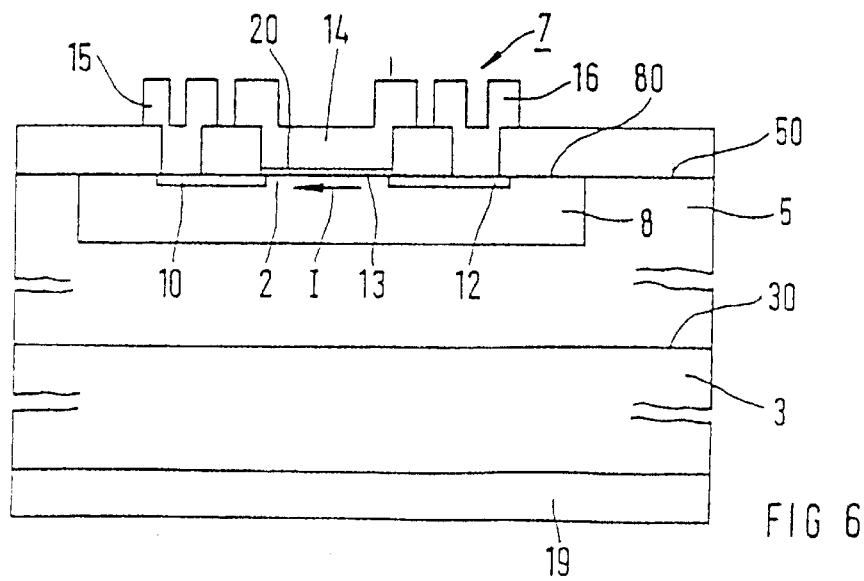
FIG. 6 is a sectional view of a semiconductor configuration embodied as a lateral SiC MOSFET.

Referring now to FIGS. 5 and 6, there is illustrated an exemplary embodiment of a semiconductor configuration having a lateral MOSFET structure as electronically active structure 7. A comparatively thin α-SiC layer 5 of a predefined conductivity type (n-type or p-type conductivity) is grown homoepitaxially, in accordance with one of the above-described processes, on a misoriented substrate surface 30 of a substrate 3 made of α-SiC. The substrate surface 30 is oriented, for example, toward the (0001) crystal face (silicon side) of the α-SiC with respect to the [11$\bar{2}$0] crystal direction of the α-SiC by the angle of inclination γ. The thickness of the substrate 3 is typically between 300 μm and 400 μm, while the thickness of the layer 5 is typically several micrometers, for example 10 μm. Owing to the misoriented epitaxial growth, the layer surface 50 of the layer 5 has elevations 6, which are illustrated again in schematic and enlarged form and run parallel with one another. On the layer surface 50 of the SiC layer 5, a base region 8 which has opposite doping to the layer 5 is implanted into the layer 5 by implanting ions of one or more dopants for the desired conductivity type, for example nitrogen (N) for n-type conduction or aluminum (Al) and/or boron (B) for p-type conduction. The base region has a rectangular surface 80 on the layer surface 50. A rectangular source region 10, and a drain region 12 which is also rectangular, each being of the opposite conductivity type to that of the base region 8, are then implanted within this surface 80 of the base region 8. Typical implantation depths are less than 1 μm. The implanted regions are preferably annealed by means of high-temperature treatment. In this thermal annealing, the elevations 6 on the layer surface 50 are further strengthened and enlarged. The source region 10 is placed in contact with a source electrode 15, and the drain region 12 with a drain electrode 16 (only illustrated in FIG. 6).

That part of the base region 8 which lies between the source region 10 and the drain region 12 on the surface 80 is a channel region 2 which also has a rectangular surface 20 which coincides with the surface 80. The shorter sides 22 and 23 of the rectangular surface 20 of the channel region 2 are directed parallel with the elevations 6 and the longer sides 24 and 25 are each respectively perpendicular with respect to the elevations 6. Preferably, to this end the main direction (M in FIGS. 1 to 4) of the elevations 6 is determined either directly or preferably as a function of the predefined reference direction (REF in FIGS. 1 to 4) by crystallographic means, in the manner already described.

The length x of the shorter sides 22 and 23 is typically between approximately 1 μm and 10 μm. The length y of the longer sides 24 and 25 is generally significantly greater than the length x of the shorter sides 22 and 23, for example at least three times as large, in particular at least five times as large and preferably at least a hundred times as large.

The source region 10 and drain region 12 are preferably of the same length y as the channel region 2. An insulator region 13 (cf. FIG. 6) is applied to the surface 20 of the channel region 2. The region 13 is, in particular, a thermally grown oxide layer which is composed essentially of silicon oxide $SiO_2$. Because of the high temperatures, typically at least 1100° C., which are necessary for the thermal oxidation, and because of the anisotropy of the oxidation rates on the surface 20 of the channel region 2, the elevations 6 are also strengthened when the insulator region 13 is produced, or new elevations 6, in particular microsteps, are produced. A gate electrode 14 (illustrated only in FIG. 6) is applied to the insulator region 13 in order to control the electrical resistance in the channel region 2. When a pre-defined electrical control field is applied to the gate electrode 14, the channel region 2 is placed or kept in an on state (the same conductivity type as the source region 10) as a result of charge-carrier inversion. If an electric operating voltage is then applied between the source electrode 15 and drain electrode 16, an electric current I flows between the source region 10 and drain region 12 in the direction of the illustrated arrow (technical direction of current). The current I may be positive or negative. Because of the particular array and rectangular design of the channel region 2 between the source region 10 and drain region 12, the direction of flow of the electric current I is parallel with the elevations 6 on the surface 20 of the channel region 2. As a result, a particularly high degree of charge-carrier mobility is obtained in the channel region 2, since the charge carriers carrying the electric current I hardly intersect the elevations 6. The electrical resistance of the channel region 2, and thus the losses, are reduced as a result of this. The electronically active structure 7 of the semiconductor configuration according to FIGS. 5 and 6 corresponds to a lateral SiC MOSFET.

Figure 7:
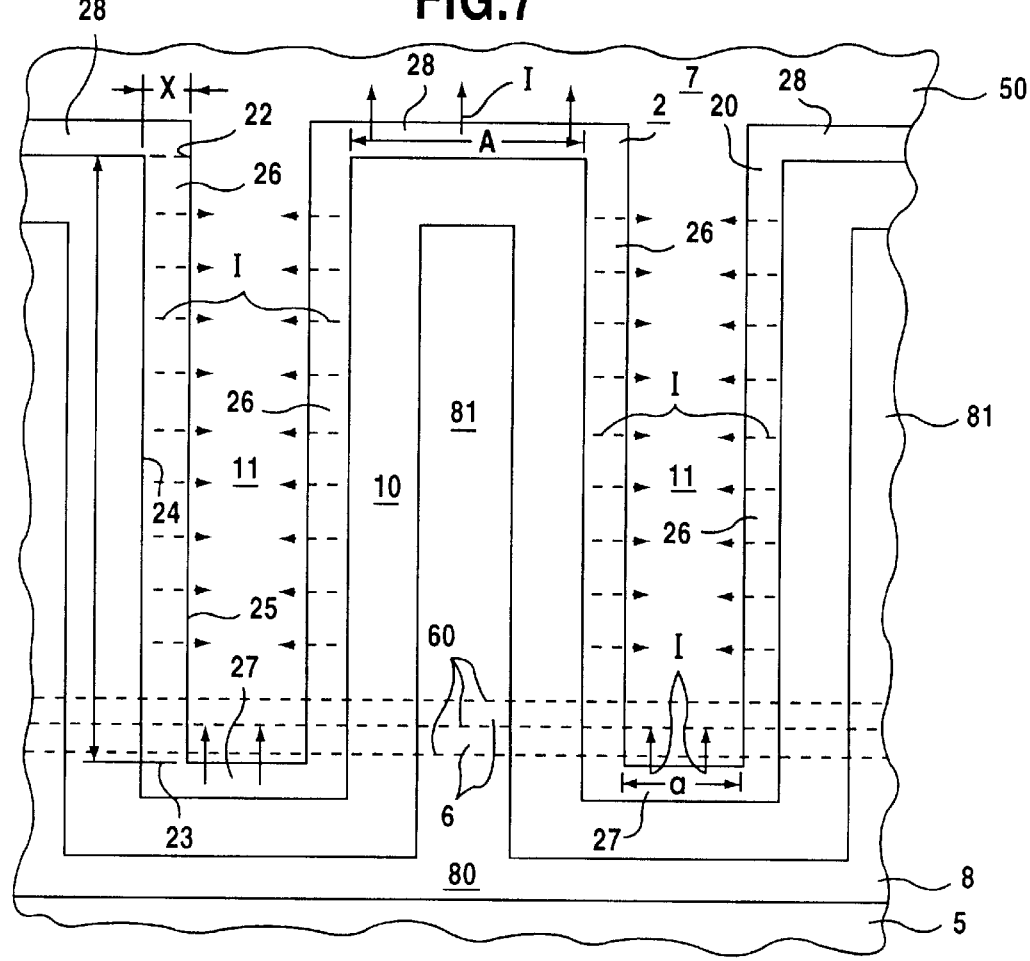
FIG. 7 is a plan view of a semiconductor configuration provided for a vertical SiC MOS component with rectangular, meandering layout.
Figure 8:
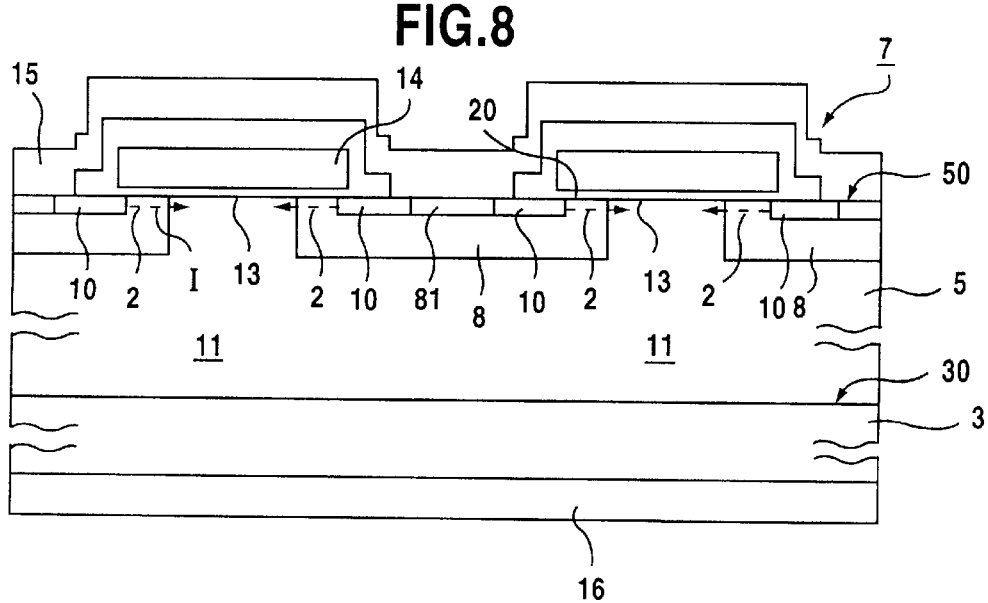
FIG. 8 is a sectional view of a semiconductor configuration embodied as a vertical SiC MOS component.

Referring now to FIGS. 7 and 8, there is shown a further exemplary embodiment of a semiconductor configuration. An α-SiC layer 5 is grown homoepitaxially on a misoriented substrate surface 30 of an α-SiC substrate 3. The layer 5 has implanted in its surface 50 a comb-like base region 8 of the opposite conductivity type to that of the layer 5. The base region 8 has implanted into it a source region 10 which runs in a meandering shape and is of the opposite conductivity type to the base region 8. The source region 10, and a more highly doped contact region 81 of the base region 8 are placed in contact with a source electrode 15 (illustrated only in FIG. 8) and are short-circuited. A drift region 11 is formed in each case in the intermediate spaces between the individual "teeth" of the comb structure of the base region 8, using the layer 5.

On the sides of the source region 10 which face away from the contact regions 81, a meandering channel region 2 on the surface 80 of the base region 8 adjoins the source region 10 in the base region 8. A gate electrode 14 is assigned to the surface 20 of the channel region 2 in a buried-gate array by means of an insulator region 13, in particular an oxide layer, in order to switch the channel region 2 from an on state into an off state, or vice versa. The channel region 2 has in each case rectangular parts 26, 27 and 28. The parts 26 have, by analogy with FIG. 5 again, shorter sides 22 and 23 of the length x and longer sides 24 and 25 of the length y. The shorter sides 22 and 23 of the rectangular parts 26 run, again, parallel with the elevations 6 on the surface 20 of the channel region 2. Thus, when an operating voltage is applied between the source electrode 15 and a drain electrode 16 (illustrated only in FIG. 8) provided on the side of the substrate 3 which faces away from the layer 5, in the on state the electric current I flows in the parts 26 of the channel region 2, parallel with the elevations 6. It is the opposite case in the further rectangular parts 27 and 28, which respectively connect the parts 26 to one another. In these parts 27 and 28, the current I flows perpendicularly with respect to the elevations 6. The lengths a of the parts 27 and A of the parts 28, running parallel with the elevations 6, are therefore kept as small as possible in relation to the length y of the parts 26.

The pn-junction which is formed with the base region 8 and the SiC layer 5 takes up the reverse junction voltage between the source electrode 15 and drain electrode 16 in the case of reverse biasing.

If the substrate 3 in the embodiment illustrated in FIGS. 7 and 8 is of the same conductivity type as the grown SiC layer 5, the electronically active structure 7 of this semiconductor configuration corresponds to a vertical MOSFET structure. On the other hand, if the substrate 3 is of the opposite conductivity type to the layer 5, an additional pn-junction between the source electrode 15 and drain electrode 16 is switched between the layer 5 and substrate 3. The electronically active structure 7 then corresponds to an IGBT structure. Through appropriate development, the MOS structure according to the invention with current which flows at least predominantly in parallel with the elevations 6 on the surface 20 in the channel region 2 can also be used for a MOS-controlled thyristor (MCT).

Instead of a meandering MOS structure, with the vertical structure according to FIGS. 7 and 8, an open, rectangular design, as in FIG. 5, can also be selected, in particular in a cell design with a plurality of base regions 8. The base region 8 does not have to be implanted, but instead can also be deposited homoepitaxially on the layer 5, in a trench MOS structure. Moreover, the invention is not restricted to semiconductor configurations with MOS structures, but instead the charge-carrier mobility increases in all current-carrying SIC regions which are near to the surface and in which, in general, undesired elevations 6 which run in parallel with one another occur.

A semiconductor configuration according to one of the preceding embodiments can be fabricated using a method with the following method steps which are to be carried out in succession:

a) a SiC substrate 3 is first prepared;

b) the SiC layer 5 is formed by means of chemical gas phase epitaxy;

c) the reference direction and the polar axis (<0001> crystal directions) of the SiC of the substrate 3 and of the layer 5 are determined by crystallographic means; and d) the electronically active structure 7 is produced by suitable fabrication steps in such a way that the current flows perpendicularly with respect to the reference direction and parallel with the surface in the channel region.

Detailed process presciptions may be found in the foregoing specification and in the above-mentioned references which are incorporated in this specification.

We claim:

1. A semiconductor configuration, comprising:
   a semiconductor body formed with at least one channel region made of monocrystalline α-SiC defining <1$\bar{1}$00> and <11$\bar{2}$0> crystal directions and having a surface formed with elevations extending substantially parallel to one another and substantially parallel with one of said <1$\bar{1}$00> or one of said <11$\bar{2}$0> crystal directions of said α-SiC;
   an electronically active structure having at least two electrodes causing an electric current to flow through said channel region when an electric operating voltage is applied in an on state of said electronically active structure, said current flowing at least largely parallel with said elevations on said surface of said channel region.

2. The semiconductor configuration according to claim 1, wherein said elevations on said surface of said channel region run substantially parallel with a [1$\bar{1}$00] crystal direction of said α-SiC.

3. The semiconductor configuration according to claim 1, wherein said elevations on said surface of said channel region are each formed with a structure selected from the group consisting of edges and steps.

4. The semiconductor configuration according to claim 3, wherein said structure of each of said elevations is a substantially rectilinear structure.

5. The semiconductor configuration according to claim 3, wherein said structure of each of said elevations runs in a zigzag shape.

6. The semiconductor configuration according to claim 1, wherein said elevations have a height between substantially 0.25 nm and substantially 80 nm.

7. The semiconductor configuration according to claim 1, wherein said elevations have a width between substantially 10 nm and substantially 2000 nm.

8. The semiconductor configuration according to claim 1, wherein said surface of said channel region is substantially rectangular, with a first and a second side extending parallel to said elevations and a third side and a fourth side extending substantially perpendicular to said first side and said second side.

9. The semiconductor configuration according to claim 8, wherein said first and second sides of said surface are shorter than said third and fourth sides.

10. The semiconductor configuration according to claim 9, wherein said first and second sides each has a length at most 0.3 times a length of each of said third and fourth sides.

11. The semiconductor configuration according to claim 10, wherein the length of each of said first and second sides is at most 0.01 times the length of each of said third and fourth sides.

12. The semiconductor configuration according to claim 1, wherein said at least one channel region is implemented in a meandering shape.

13. The semiconductor configuration according to claim 1, wherein said electronically active structure is a structure selected from a group consisting of a MIS structure with at least one channel region, MISFET structure, an IGBT structure, an MCT structure, and a JFET structure.

14. A semiconductor configuration, comprising:
   a substrate made of α-SiC defining {0001} crystal faces, and <0001>, <1$\bar{1}$00>, and <11$\bar{2}$0> crystal directions, said substrate having a substrate surface inclined against one of the {0001} crystal faces by a predefined angle between substantially 1° and substantially 20° with respect to a reference direction perpendicular to one of said <0001> crystal directions of the α-SiC, the reference direction being a crystal direction selected from a group consisting of the <1$\bar{1}$00> and <11$\bar{2}$0> crystal directions;
   an α-SiC layer homoepitaxially grown on said substrate surface of said substrate, said α-SiC layer having a remote surface facing away from said substrate surface;
   a channel region formed in said remote surface of said α-SiC layer; and
   an electronically active structure having at least two electrodes causing an electric current to flow through said at least one channel region when an electric operating voltage is applied in an on state thereof, whereby the electric current flows at least predominantly perpendicular with respect to the reference direction and perpendicular with respect to a direction selected from a group consisting of the <0001> crystal directions of the α-SiC of said substrate and the <0001> crystal directions of said α-SiC layer.

15. The semiconductor configuration according to claim 14, wherein the reference direction is the [11$\bar{2}$0] crystal direction of the α-SiC of said substrate.

16. The semiconductor configuration according to claim 14, wherein said channel region has a surface coinciding with said remote surface of said layer, said coinciding surface being shaped substantially as a rectangle with a first side and a second side extending substantially perpendicular to the reference direction, and a third side and a fourth side extending substantially perpendicular to the first side and the second side.

17. The semiconductor configuration according to claim 16, wherein said first side and said second side are relatively short sides of the rectangle, and said third side and said fourth side are relatively long sides of the rectangle.

18. The semiconductor configuration according to claim 17, wherein said first side and said second side each has a length at most 0.3 times a length of each of said third side and said fourth side.

19. The semiconductor configuration according to claim 18, wherein the length of each of said first side and said second side is at most 0.01 times the length of each of said third side and said fourth side.

20. The semiconductor configuration according to claim 14, wherein said at least one channel region is implemented in a meandering shape.

21. The semiconductor configuration according to claim 14, wherein said electronically active structure is a structure selected from a group consisting of a MIS structure with at least one channel region, MISFET structure, an IGBT structure, an MCT structure, and a JFET structure.

* * * * *